United States Patent
Lewis et al.

(10) Patent No.: US 6,797,620 B2
(45) Date of Patent: Sep. 28, 2004

(54) METHOD AND APPARATUS FOR IMPROVED ELECTROPLATING FILL OF AN APERTURE

(75) Inventors: John S. Lewis, San Jose, CA (US); Srinivas Gandikota, Santa Clara, CA (US); Sivakami Ramanathan, Fremont, CA (US); Girish Dixit, San Jose, CA (US); Robin Cheung, Cupertino, CA (US); Fusen Chen, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 111 days.

(21) Appl. No.: 10/124,095

(22) Filed: Apr. 16, 2002

(65) Prior Publication Data

US 2003/0194850 A1 Oct. 16, 2003

(51) Int. Cl.$^7$ .............................................. H01L 21/44
(52) U.S. Cl. ................................................... 438/687
(58) Field of Search ............................... 438/687, 631, 438/633, 637, 648, 678, 722, 685, 592, 532, 383, 238, 714, 679

(56) References Cited

U.S. PATENT DOCUMENTS

| | | | |
|---|---|---|---|
| 4,381,595 A | 5/1983 | Denda et al. ................. 29/589 |
| 4,884,123 A | 11/1989 | Dixit et al. ................... 357/71 |
| 4,897,907 A | 2/1990 | Kopiec et al. ............. 29/888.4 |
| 4,920,073 A | 4/1990 | Wei et al. ................... 437/200 |
| 4,938,996 A | 7/1990 | Ziv et al. ................... 427/53.1 |
| 4,960,732 A | 10/1990 | Dixit et al. ................. 437/192 |
| 4,985,750 A | 1/1991 | Hoshino ..................... 357/71 |
| 4,987,099 A | 1/1991 | Flanner ...................... 437/192 |
| 4,994,410 A | 2/1991 | Sun et al. ................... 437/192 |
| 5,091,339 A | 2/1992 | Carey ......................... 437/187 |
| 5,100,501 A | 3/1992 | Blumenthal et al. ........ 156/643 |
| 5,110,759 A | 5/1992 | Mukai ......................... 437/173 |

(List continued on next page.)

FOREIGN PATENT DOCUMENTS

| | | | |
|---|---|---|---|
| DE | 3 743591 | 7/1988 | ......... H01L/21/283 |
| EP | 0 566 253 | 10/1993 | ....... H01L/21/3205 |
| JP | 6-39925 | 7/1988 | ......... H01L/21/285 |
| JP | 6-232077 | 8/1994 | ......... H01L/21/285 |
| JP | 8-10693 | 1/1996 | |
| JP | 2-513900 | 4/1996 | |

OTHER PUBLICATIONS

European Search Report for Application No. 97307355.4 dated May 20, 1999 (AMAT/1689EP).

Search and Examination Report for Singapore Application No. 9703453–2 dated Aug. 13, 1998 (AMAT/1689.SG).

Granneman, E.H.A., "Multi–Level Metallization: Future Prospects," European Transactions on Telecommunications and Related Technologies, vol. 1, No. 2, Mar./Apr. 1990.

*Primary Examiner*—Evan Pert
*Assistant Examiner*—Monica D. Harrison
(74) *Attorney, Agent, or Firm*—Moser, Patterson & Sheridan

(57) ABSTRACT

A method and apparatus is provided for filling apertures formed in a substrate surface by depositing materials that selectively inhibit or limit the formation or growth of subsequent layers used to fill an aperture. In one aspect, a method is provided for processing a substrate including providing a substrate having a field and apertures formed therein, wherein the apertures each have a bottom and sidewalls, depositing a seed layer on the bottom and sidewalls of the apertures, depositing a growth-inhibiting layer on at least one of the field of the substrate or an upper portion of the sidewalls of the apertures, and depositing a conductive layer on the growth-inhibiting layer and the seed layer. Deposition of the growth-inhibiting layer improves fill of the aperture from the bottom of the aperture up to the field of the substrate.

35 Claims, 3 Drawing Sheets

U.S. PATENT DOCUMENTS

| | | |
|---|---|---|
| 5,147,819 A | 9/1992 | Yu et al. ..................... 437/173 |
| 5,192,714 A | 3/1993 | Suguro et al. ............... 437/195 |
| 5,250,465 A | 10/1993 | Iizuka et al. ................. 437/173 |
| 5,266,521 A | 11/1993 | Lee et al. .................... 437/188 |
| 5,300,455 A | 4/1994 | Vuillermoz et al. ......... 437/190 |
| 5,354,712 A | 10/1994 | Ho et al. ..................... 437/195 |
| 5,429,991 A | 7/1995 | Iwasaki et al. .............. 437/192 |
| 5,480,836 A | 1/1996 | Harada et al. ............... 437/192 |
| 5,514,525 A | 5/1996 | Bloom et al. ............. 430/273.1 |
| 5,534,462 A | 7/1996 | Fiordalice et al. .......... 437/190 |
| 5,567,987 A | 10/1996 | Lee ............................. 257/751 |
| 5,585,308 A | 12/1996 | Sardella ...................... 437/190 |
| 5,585,673 A | 12/1996 | Joshi et al. ................. 257/751 |
| 5,618,756 A | 4/1997 | Chew et al. ................. 438/586 |
| 5,670,425 A * | 9/1997 | Schinella et al. ............ 437/195 |
| 5,858,637 A | 1/1999 | Eshelman et al. ........... 430/569 |
| 6,001,420 A * | 12/1999 | Mosely et al. ............... 427/258 |
| 6,100,193 A | 8/2000 | Suehiro et al. .............. 438/685 |
| 6,153,488 A | 11/2000 | Yoshino ...................... 438/345 |
| 6,171,941 B1 | 1/2001 | Park et al. ................... 438/586 |
| 6,287,902 B1 | 9/2001 | Kim ............................ 438/183 |
| 6,287,977 B1 | 9/2001 | Hashim et al. .............. 438/722 |
| 6,297,091 B1 | 10/2001 | Roh et al. .................... 438/256 |
| 6,430,458 B1 | 8/2002 | Mosely et al. ............... 700/121 |
| 6,559,061 B2 * | 5/2003 | Hashim et al. .............. 438/722 |

* cited by examiner

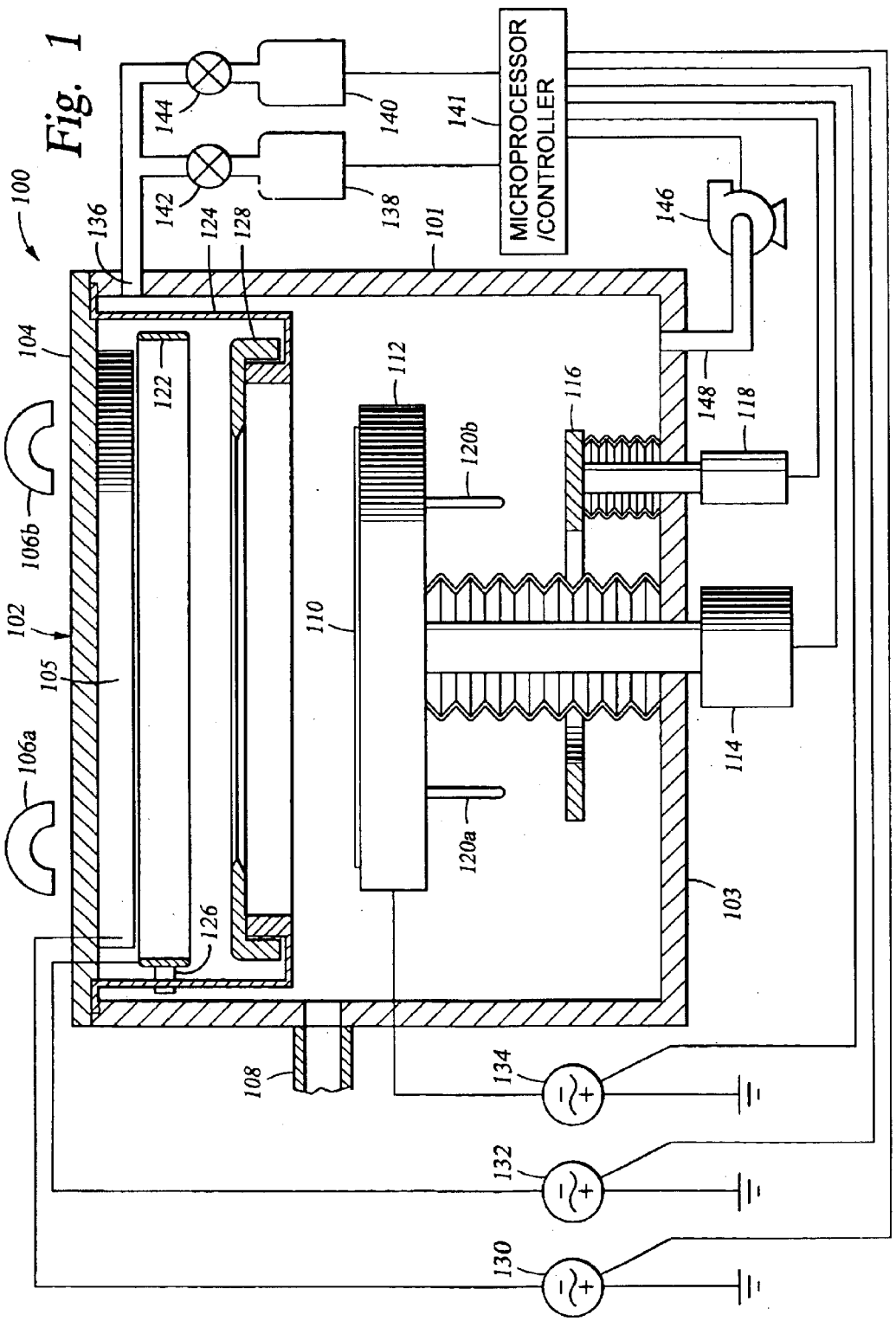

METHOD AND APPARATUS FOR IMPROVED ELECTROPLATING FILL OF AN APERTURE

BACKGROUND OF THE INVENTION

1. Field of the Invention

Embodiments of the invention described herein relate to a metallization process for manufacturing semiconductor devices and to filling an aperture.

2. Description of the Related Art

Sub-quarter micron, multi-level metallization is one of the key technologies for the next generation of ultra large-scale integration (ULSI). The multilevel interconnects that lie at the heart of this technology require planarization of interconnect apertures formed in high aspect ratio apertures, including contacts, vias, lines, dual damascenes, and other apertures. Reliable formation of these interconnect apertures is very important to the success of ULSI and to the continued effort to increase circuit density and quality on individual substrates and die.

As circuit densities increase, the widths of vias, contacts, dual damascenes, and other apertures, as well as the dielectric materials between them, decrease to less than 250 nanometers, whereas the thickness of the dielectric layers remains substantially constant, with the result that the aspect ratios for the apertures, i.e., their height divided by width, increases. Many traditional deposition processes, such as physical vapor deposition (PVD) and chemical vapor deposition (CVD), have difficulty filling structures, such as dual damascenes, where the aspect ratio exceed 4:1, and particularly where it exceeds 10:1. Therefore, there is a great amount of ongoing effort being directed at the formation of void-free, nanometer-sized apertures having high aspect ratios wherein the ratio of aperture height to aperture width can be 4:1 or higher. Additionally, as the aperture width decrease, the device current remains constant or increases, which results in an increased current density in the aperture.

Currently, copper and its alloys have become the metals of choice for sub-quarter-micron interconnect technology because copper has a lower resistivity than aluminum, (1.7 Ω-cm compared to 3.1 Ω-cm for aluminum), and a higher current carrying capacity and significantly higher electromigration resistance. These characteristics are important for supporting the higher current densities experienced at high levels of integration and increased device speed. Further, copper has a good thermal conductivity and is available in a highly pure state.

Despite the desirability of using copper for semiconductor device fabrication, choices of fabrication methods for depositing copper into very high aspect ratio apertures, such as a 4:1 aspect ratio via having a width of 0.35μ or less, are limited. As a result of these process limitations, electroplating, which had previously been limited to the fabrication of lines on circuit boards, is just now being used to fill vias and contacts on semiconductor devices.

Electroplating processes deposit a material on a conductive surface by the chemical reduction of metal ions in a chemical solution by the application of an external electrical current. Electroplating processes require a conductive barrier layer being deposited on a substrate surface prior to electroplating to prevent electroplated materials, such as copper, from diffusing into the underlying substrate. Diffusion of electroplated materials, such as copper, into underlying dielectric materials can lead to forming short-circuits or result in device failure. The conductive barrier layer may be deposited by physical vapor deposition techniques or chemical vapor deposition techniques. However, conventional barrier layer materials often do not provide a sufficiently conductive surface for effective electroplating deposition, and a electroplating nucleation or "seed" layer is deposited on the conductive barrier layer to provide sufficient nucleation of electroplating material.

Electroplating processes typically require the electrically conductive seed layer to be thin and conformally deposited on the substrate to provide a surface on the substrate to adequately initiate the electroplating process. The seed layer typically comprises a conductive metal, such as copper, and is conventionally deposited on the substrate using physical vapor deposition (PVD) or chemical vapor deposition (CVD) techniques. It has been found that conformal deposition of the seed layer results in good electroplating of the substrate.

However, deposition mechanisms for filling apertures using electroplating chemistries have proven difficult to control even with the use conformal seed layers. One mechanism that has been observed when electroplating apertures is known as the "superfill" mechanism, which usually results in the narrowest apertures being filled at an increased rate than wider apertures. As such, excess material, also referred to as overburden or overfill, is deposited over the narrow apertures while the wider apertures are still being electroplated.

A protuberance, or peak, over the narrowest apertures, relative to a depression, or valley, over the wider apertures, can be formed in the surface of the excess material deposited over the apertures. The presence of peaks and valleys in the substrate surface may detrimentally affect subsequent planarization processes, such as chemical mechanical polishing. For example, less than effective planarization of the substrate surface may result in the presence of residual material on the substrate surface. Overpolishing of substrate surface tom remove the residual material materials may result in topographical defects, such as dishing or removal of materials from inside the apertures, which defects can detrimentally affect subsequent processing of the substrate.

Therefore, there is a need for methods for metallizing an aperture with minimal overburden and greater planarization of the substrate surface.

SUMMARY OF THE INVENTION

Aspects of the invention described herein generally relate to depositing materials that inhibit or limit the nucleation or growth of subsequently deposited materials in the apertures to allow for selective fill of apertures formed on the field of a substrate. In one aspect, a method is provided for processing a substrate having a field and an aperture comprising a bottom and sidewalls formed therein, the method including depositing a seed layer on the bottom and sidewalls of the aperture, and depositing a growth-inhibiting layer on at least one of the field of the substrate and an upper portion of the sidewalls of the aperture.

In another aspect off the invention, a method is provided for processing a substrate having a field and an aperture comprising a bottom and sidewalls formed therein, the method including depositing a first copper layer on the bottom and sidewalls of the aperture, depositing a growth inhibiting material selected from the group of silicon dioxide, aluminum, tantalum, nickel, titanium, tungsten, and combinations thereof, on at least one of the field of the substrate and an upper portion of the sidewalls of the aperture, and depositing a second copper layer on the growth inhibiting material and the first copper layer, wherein the second copper layer is deposited on the first copper layer at a greater rate than on the material capable of forming native oxides.

In another aspect off the invention, a method is provided for processing a substrate having a field and an aperture comprising a bottom and sidewalls formed therein, the method including depositing a seed layer on the bottom and sidewalls of the aperture, depositing a growth-inhibiting layer on at least one of the field of the substrate and an upper portion of the sidewalls of the aperture, and depositing a conductive layer on the seed layer at a rate between about 500 angstroms per minute and about 3500 angstroms per minute greater than on the growth-inhibiting layer, wherein at least a portion of the growth-inhibiting layer is removed during deposition of the conductive layer.

In another aspect off the invention, a method is provided for processing a substrate having a field and an aperture comprising a bottom and sidewalls formed therein, the method including depositing a nucleation layer on the bottom and sidewalls of the aperture, depositing a nucleation inhibiting material selected from the group of silicon, silicon dioxide, aluminum, aluminum oxide, tantalum, tantalum oxide, nickel, nickel oxide, titanium, titanium oxide, tungsten, tungsten oxide, and combinations thereof, on at least one of the field of the substrate and an upper portion of the sidewalls of the aperture, and depositing a conductive material on the nucleation layer and the nucleation inhibiting material by an electrochemical deposition technique.

BRIEF DESCRIPTION OF THE DRAWINGS

So that the manner in which the apertures described herein are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 is a schematic cross-sectional view of one embodiment of an IMP-PVD chamber;

DETAILED DESCRIPTION OF THE PREFERRED EMBODIMENT

Figure 2A:
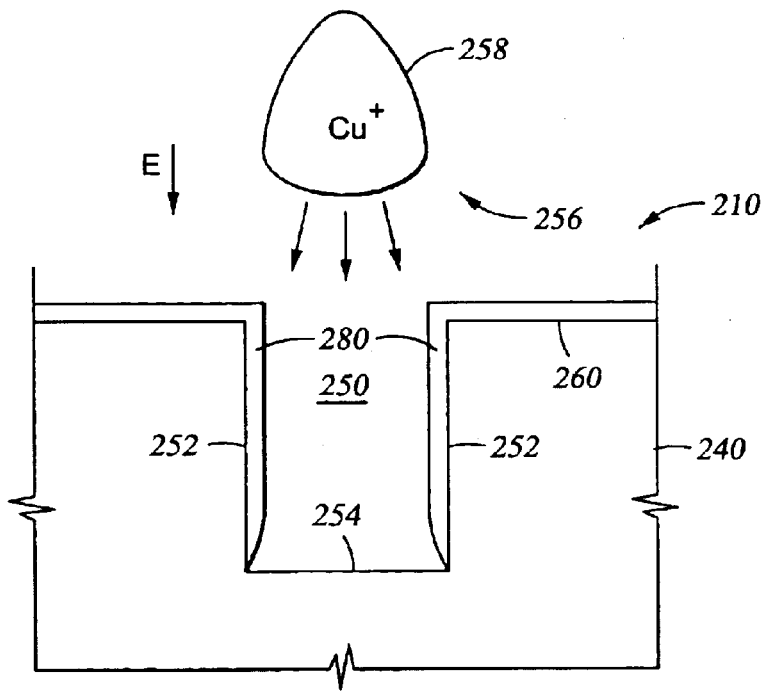
FIGS. 2A and 2B are schematic representation of the angular distribution of ions effected by low pressure and high pressure, respectively.

The invention described herein generally relates to depositing materials that inhibit or limit the nucleation or growth of subsequent layers to promote "bottom-up" fill of apertures in a subsequent electroplating process. In one aspect, the growth-inhibiting layer is selectively deposited on at least one of the field of the substrate or the upper portion of the aperture. The growth-inhibiting layer may be deposited by a physical vapor deposition technique, such as a high-pressure physical vapor deposition technique, an ionized metal plasma physical vapor deposition technique, or a self-ionized plasma physical vapor deposition technique.

The words and phrases used herein should be given their ordinary and customary meaning in the art by one skilled in the art unless otherwise further defined. Growth-inhibiting layer is broadly defined herein as a continuous or discontinuous layer of material deposited to limit, reduce, or inhibit nucleation of subsequently deposited material. Seed layer is broadly defined herein as a continuous or discontinuous layer of material deposited to promote or increase the nucleation of subsequently deposited material. Native oxides are broadly defined herein as oxides of a material formed from exposure to an oxidizing source, such as an oxygen-containing atmosphere.

The invention will be described below in reference to a physical vapor deposition process (PVD) technique, that can be carried out using process equipment, such as an Endura® platform, available from Applied Materials, Inc., located in Santa Clara, Calif. The equipment may include an integrated platform having a high-density plasma physical vapor deposition (HDP-PVD) chamber, such as an ion metal plasma PVD (IMP-PVD) processing chamber, known as an IMP VECTRA™ chamber, available from Applied Material Inc. of Santa Clara, Calif. The equipment may also include an integrated platform having a deposition chamber adapted to perform a Self-ionized Plasma (SIP) physical vapor deposition technique (SIP-PVD). The invention contemplates any chamber enabling the selective deposition of materials on a substrate or in an aperture can be used to advantage with the processes described herein.

FIG. 1 is a schematic cross-sectional view of an IMP chamber 100. The IMP chamber can be integrated into an Endura™ platform, also available from Applied Materials, Inc., of Santa Clara, Calif. The IMP process provides higher density plasma (HDP) than standard PVD that causes the sputtered target material to become ionized as the sputtered material passes therethrough. The HDP-PVD ionization enables the sputtered material to be attracted in a substantially perpendicular direction to a biased substrate surface and to conformally deposit a layer even in high aspect ratio apertures. The chamber 100 includes sidewalls 101, lid 102, and bottom 103. The lid 102 includes a target backing plate 104 that supports a target 105 of the material to be deposited. The target 105 may comprise a conductive material capable of forming native oxides or inhibiting the growth of subsequently deposited layers including silicon (dioxide), aluminum, tantalum, nickel, titanium, tungsten, and combinations thereof. The invention also contemplated the deposition of nitrides thereof, for example, tantalum nitride or tungsten nitride.

An opening 108 in the chamber 100 provides access for a robot (not shown) to deliver and retrieve substrates 10 to and from the chamber 100, wherein the substrate 110 is received in the chamber 100 and positioned on a substrate support 112. The substrate support 112 supports the substrate 110 for depositing a layer of sputtered material in the chamber and is typically grounded. The substrate support 112 is mounted on a lift motor 114 that raises and lowers the substrate support 112 and a substrate 110 disposed thereon. A lift plate 116 connected to a lift motor 118 is mounted in the chamber 100 and raises and lowers pins 120a, 120b mounted in the substrate support 112. The pins 120a, 120b raise and lower the substrate 110 from and to the surface of the substrate support 112.

A coil 122 is mounted between the substrate support 112 and the target 105 and provides inductively-coupled magnetic fields in the chamber 100 to assist in generating and maintaining a plasma between the target 105 and substrate 110. The coil 122 is sputtered due to its location between the target and the substrate 110 and may be made of similar constituents as the target 105. For instance, the coil 122 could be made of copper and phosphorus. The doping percentage of the coil 122 could vary compared to the target doping percentage depending on the desired layer composition and is empirically determined by varying the relative doping percentages. Power supplied to the coil 122 densifies the plasma that ionizes the sputtered material. The ionized material is then directed toward the substrate 110 and deposited thereon.

A shield 124 is disposed in the chamber 100 to shield the chamber sidewalls 101 from the sputtered material. The shield 124 also supports the coil 122 by coil supports 126. The coil supports 126 electrically insulate the coil 122 from the shield 124 and the chamber 100 and can be made of similar material as the coil. The clamp ring 128 is mounted between the coil 122 and the substrate support 112 and shields an outer edge and backside of the substrate 110 from sputtered materials when the substrate 110 is raised into a processing position to engage the lower portion of the clamp ring 128. In some chamber configurations, the shield 124 supports the clamp ring 128 when the substrate 110 is lowered below the shield 124 to enable substrate transfer.

Three power supplies are used in this type of sputtering chamber. A power supply 130, which my be a DC power supply, for example, may deliver power to the target 105 to cause the processing gas to form a plasma, although RF power can be used. Magnets 106a, 106b disposed behind the target backing plate 104 increase the density of electrons adjacent to the target 105, thus increasing ionization at the target to increase the sputtering efficiency. The magnets 106a, 106b generate magnetic field lines generally parallel to the face of the target, around which electrons are trapped in spinning orbits to increase the likelihood of a collision with, and ionization of, a gas atom for sputtering. A power supply 132, which may be a RF power supply, supplies electrical power to the coil 122 to increase the density of the plasma. Another power supply 134, which may be a DC power supply, biases the substrate support 112 with respect to the plasma and provides directional attraction of the ionized sputtered material toward the substrate 110.

Processing gas, such as an inert gas of argon or helium or a reactive gas such as nitrogen for a nitrided target material deposition, is supplied to the chamber 100 through a gas inlet 136 from gas sources 138, 140 as metered by respective mass flow controllers 142, 144. A vacuum pump 146 is connected to the chamber 100 at an exhaust port 148 to exhaust the chamber 100 and maintain the desired pressure in the chamber 100.

A controller 141, such as a microprocessor controller, generally controls the functions of the power supplies, lift motors, mass flow controllers for gas injection, vacuum pump, and other associated chamber components and functions. The controller 141 controls the power supply 130 coupled to the target 105 to cause the processing gas to form a plasma and sputter the target material. The controller 141 also controls the power supply 132 coupled to the coil 122 to increase the density of the plasma and ionize the sputtered material. The controller 141 also controls the power supply 134 to provide directional attraction of the ionized sputtered material to the substrate surface. The controller 141 executes system control software stored in a memory, which in the preferred embodiment is a hard disk drive, and can include analog and digital input/output boards, interface boards, and stepper motor controller boards (not shown). Optical and/or magnetic sensors (not shown) are generally used to move and determine the position of movable mechanical assemblies.

An exemplary process regime for the IMP-PVD deposition of suitable materials described herein, for example, aluminum, silicon (dioxide), nickel, tantalum, titanium, tungsten, and combinations thereof, from a target comprising the suitable materials is as follows for a 200 mm wafer. An inert gas, such as helium or argon, is introduced into the chamber at a rate sufficient to produce a chamber pressure between about 0.5 mTorr and about 100 mTorr, for example between about 20 mTorr and about 50 mTorr.

The power level supplied to the substrate support may be between about 0 W and about 500 W when the power to the target and the coil are between about 1 kW and about 3 kW. Additionally, the substrate power may be about 300 W for a 200 mm substrate. The power density applied to the substrate support may be between about 0.5 W/cm$^2$ and about 1.6 W/cm$^2$. For example an applied power density of about 1.0 W/cm$^2$ may be used. For a 300 mm substrate, the power level supplied to the substrate support may be between about 500 W and about 1000 W, for example, about 750 W, and the power density may be between about 0.7 W/cm$^2$ and about 1.4 W/cm$^2$, for example, about 1.0 W/cm$^2$.

The target in the IMP-PVD chamber can be DC-biased between about 200 watts (W) and about 24 kilowatts (kW) and between about 20 V and about 2400 V. For example, the DC-biased may be between about 1 kW and about 3 kW and between about 100 V and about 300 V. The coil may be RF-biased between about 200 W and about 24 kW, for example, between about 1 kW and about 3 kW. The substrate may be maintained at a temperature between about 10° C. and about 400°, such as below about 300°. An oxide of the target material may be deposited by including a source of oxidizing gas, such as oxygen ($O_2$) or ozone ($O_3$), in the processing gases during the sputtering process.

Selective deposition of a material on the field or sidewall of an aperture may be accomplished by the IMP-PVD process described above by controlling the deposition pressure. The angular distribution of ions based upon pressure may be understood with reference to FIGS. 2A and 2B which show a cross-section of a substrate 210 comprising a dielectric material 240 with a field 260 and an aperture 250 having sidewalls 252 and a bottom 254 formed therein.

At reduced deposition pressures, or low pressure, such as between about 10 mTorr and about 20 mTorr, the angular distribution 256 of incoming ions 258, shown here as Cu ions, results in a greater deposition rate on sidewalls 252 of the aperture 250 than the bottom 254 to form a layer 280 thereon, for example, as shown in FIG. 2A. The angular distribution 256 results because of a decrease in the proportion of ionized sputtered atoms. At reduced chamber pressures, the plasma density is decreased, thereby resulting in fewer collisions between the sputtered atoms and the plasma constituents and hence, less ionization of the sputtered atoms. Since the unionized atoms are unaffected by the bias on the substrate, the angular distribution 256 approaches a cosine distribution, or wide distribution, producing a relatively higher rate of deposition on the sidewalls 252 and field 260 of the substrate 210. The cosine distribution also allows formation of the layer 280 on the field 260 of the substrate surrounding the aperture 250.

Figure 2B:
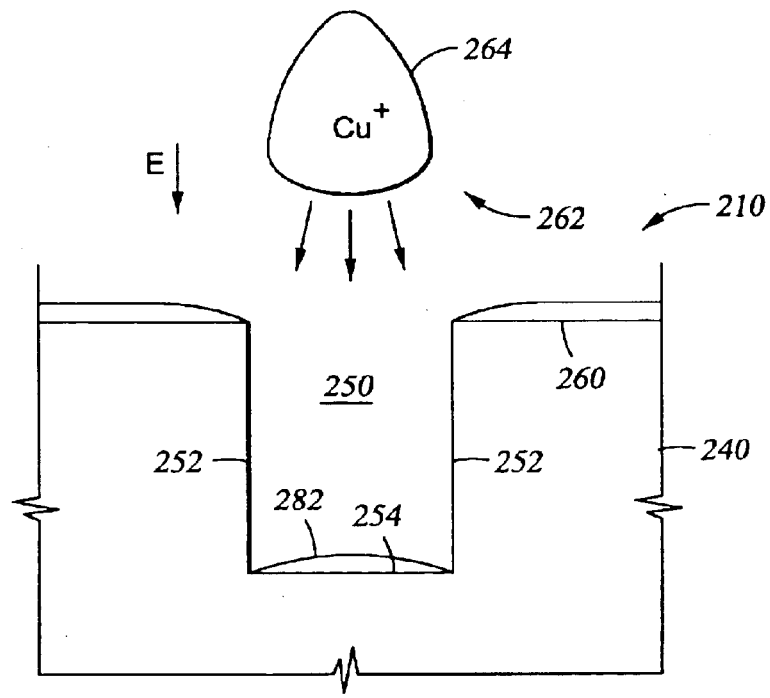

Increased or higher deposition pressures, such as between about 35 mTorr and about 70 mTorr, the angular distribution 262 of incoming ions 264 is altered or narrowed to effect a greater deposition rate at the bottom 254 of the aperture 250 as compared to the sidewalls 252, thereby producing a layer 282 on the bottom 254 and field 260 of the aperture 250, as shown in FIG. 2B. The angular distribution 262 is a result of the increased ionization associated with a relatively higher chamber pressure. An applied bias to the substrate surface would also increase the directionality of ionized materials to deposit normal to the substrate surface and minimize or reduce deposition on the sidewalls 252 of apertures definitions 250.

Selective deposition on the field and sidewalls of the apertures may be achieved by depositing the growth inhibiting materials at reduced or relatively low deposition pressures, such as between about 10 mTorr and about 20 mTorr, for an IMP-PVD deposition process. The IMP-PVD process described herein in merely illustrative of the selective deposition process, and the invention contemplates that the selective deposition process may be performed by additional apparatus or processes to provide the desired deposition of the growth-inhibiting layer.

For example, a PVD process may be used to deposit the growth-inhibiting layer. In a PVD process or self-ionized PVD process, increased deposition pressure results in a greater number of collision, and thus, in a greater angular distribution of depositing ions from increase ion collisions. The greater the angular distribution of the ions, the greater deposition rate on the surface of a substrate and on the sidewalls of an aperture compared to the bottom of an aperture. A lower or reduced pressure for such a PVD process alters the angular distribution of the depositing ions to effect a greater deposition rate at a bottom of the aperture compared to the sidewalls of an aperture due to a decrease in ion interaction and collision. Generally, a bias is not applied to the substrate during this PVD process for increased angular distribution of the ions. A PVD deposition process using DC power only may be performed, for example, in a SIP™ PVD processing chamber or Aluminum Low-Pressure Seed (ALPS+) PVD processing chamber, commercially available from Applied Materials Inc., of Santa Clara, Calif.

An exemplary process regime for the PVD deposition of suitable materials described herein, for example, aluminum, silicon (dioxide), nickel, tantalum, titanium, tungsten, and combinations thereof, from a target comprising the suitable materials is as follows for a 200 mm wafer. An inert gas, such as helium or argon, is introduced into the chamber at a rate sufficient to produce a chamber pressure between about 0.5 mTorr and about 10 mTorr, for example, between about 1 mTorr and about 5 mTorr.

The power density applied to the process may be between about 0.5 W/cm$^2$ and about 16 W/cm$^2$, for example, about 3.2 W/cm$^2$, or a power level between about 500 W and about 5000 watts, for example, about 1000 watts, for a 200 mm substrate. The substrate is maintained at a temperature between about 10° C. and about 400° C., such as below about 300° C. An oxide of the target material may be deposited by including a source of oxidizing gas, such as oxygen ($O_2$) or ozone ($O_3$), in the processing gases during the sputtering process.

The Deposition Process

FIGS. 3A–3E are schematic cross-sectional views of the deposition and utilization of a nucleation growth-inhibiting layer ("growth-inhibiting layer" hereafter) in a metallization sequence, such as for an electroplating metallization sequence. The growth-inhibiting layer is used in the metallization sequence described herein to limit subsequent deposition of material on the field of the substrate and/or an upper portion of an aperture in a subsequent electrochemical deposition process, such as an electroplating process, to promote preferential fill of the aperture from the bottom of the aperture up to the top of the aperture or field of the substrate.

The growth-inhibiting layer is deposited in an aperture and/or on the field of a substrate surrounding the aperture prior to filing the aperture, such as by an electroplating process. The growth-inhibiting layer may be deposited on a seed layer, such as a copper seed layer, or other nucleating layer disposed in the aperture and/or on the field of the substrate surrounding the aperture. The growth-inhibiting layer may or may not be consumed, dissolved, or otherwise removed during a subsequent deposition process. For example, an electroplating bath during the electroplating process may consume, dissolve, or otherwise remove a growth-inhibiting layer when electroplating a layer in an aperture. The growth-inhibiting layer may be formed of materials that form native oxides, which limit or inhibit nucleation thereon. Examples of suitable growth inhibiting materials include silicon, aluminum, nickel, tantalum, titanium, tungsten, and including oxides of aluminum, silicon (dioxide), titanium, tantalum, and tungsten, and combinations thereof. The invention further contemplates that other materials may be used that inhibit or reduce subsequent growth of materials thereon.

Figure 3A:
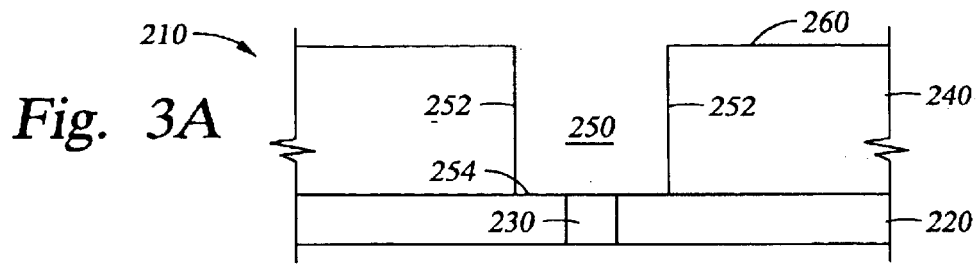
FIGS. 3A–3E are schematic cross-sectional views of one embodiment of depositing and utilizing an growth-inhibiting layer in a metallization sequence

FIG. 3A is a cross-sectional view of a substrate 210 comprising an underlying dielectric material 220, such as a silicon-based material, a contact, via or interconnect aperture 230 formed therein and a dielectric layer 240 disposed thereon. The dielectric layer 240 includes an aperture 250 defined by sidewalls 252 and a bottom 254 formed therein. The field 260 of the substrate surrounds the aperture 250.

The dielectric layer 240 may comprise any of various dielectric materials known or unknown that may be employed in the manufacture of semiconductor devices. For example, dielectric materials, such as silicon dioxide, phosphorus-doped silicon glass (PSG), boron-phosphorus-doped silicon glass (BPSG), and carbon-doped silicon dioxide, can be employed. The dielectric layer may also include low dielectric constant (low k) materials, including fluoro-silicon glass (FSG), polymers, such as polymides, silicon carbide, such as BLOk™ dielectric materials, available from Applied Materials, Inc. of Santa Clara, Calif., and carbon-containing silicon oxides, such as Black Diamond™ dielectric materials, available from Applied Materials, Inc. of Santa Clara, Calif. An aperture 250 is formed in the dielectric layer 240 by conventional photolithographic and etching techniques.

The substrate 210 may be subjected to a cleaning process such as plasma bombardment and/or reactive/plasma pre-cleaning in a pre-cleaning chamber wherein native oxides or other contaminants on the surface are removed. Plasma cleaning processes may include plasmas of an inert gas, such as a noble gas, for example helium, or nitrogen, a reducing gas, such as hydrogen gas or ammonia, or combinations thereof.

Figure 3B:
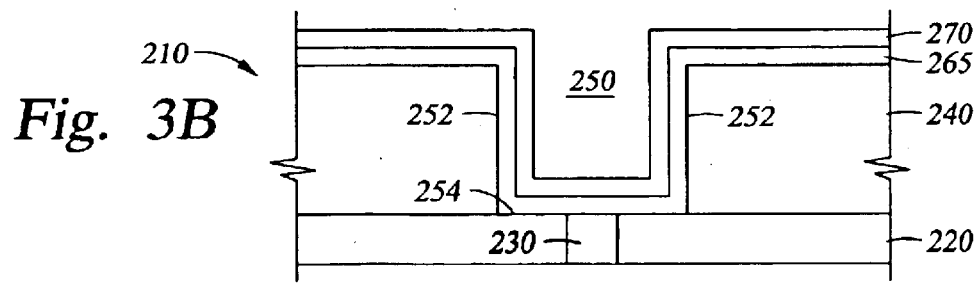

The substrate 210 is moved into a deposition chamber, such as an IMP-PVD chamber as described in FIG. 1 or a chamber adapted to perform PVD or SIP-PVD plasma deposition techniques. A barrier layer 265 is deposited over the bottom 254 and sidewalls 252 of the substrate 210, as well as the field 260 of the substrate, as shown in FIG. 3B. The barrier layer material is used to prevent a subsequently deposited material from diffusing into the surrounding dielectric material 240. The barrier layer 265 may comprise, for example, tantalum, tantalum nitride, tungsten, tungsten nitride, titanium, titanium nitride or combinations thereof, for a copper metallization scheme. Barrier layer material may be deposited by a chemical vapor deposition technique or a physical vapor deposition technique including IMP-PVD deposition techniques or SIP-PVD deposition techniques. An example of a SIP barrier deposition technique and associated chamber is more fully described in U.S.

patent application Ser. No. 09/916,412, filed on Jul. 26, 2001, entitled "SIP Ta/TaN Barrier Layer for Copper Metallization, "which is incorporated by reference herein to the extent not inconsistent with the specification or claims described herein.

Following deposition of the barrier layer 265, a seed layer 270 may be deposited in the aperture 250 and over the barrier layer 265 disposed on the field 260 of the substrate surface. The seed layer 270 may be disposed by a chemical vapor deposition technique, a physical vapor deposition technique, or an electrochemical deposition technique, such as an electroless deposition technique. The seed layer 270 may be continuous or non-continuous. The seed layer 270 generally includes a material that will nucleate the deposition of a copper fill layer, for example, copper or nickel. In one embodiment, the barrier layer 265 and the seed layer 270 are each deposited to a thickness between about 10 Å and about 450 Å, such as about 50 Å on the substrate field 260 and in the aperture 250.

Figure 3C:
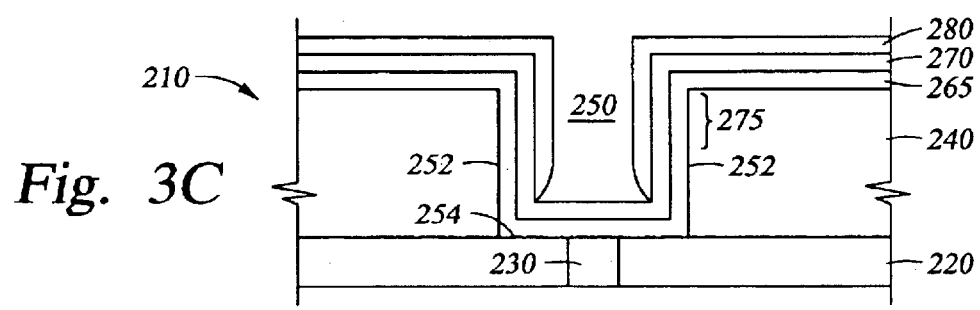

FIG. 3C shows the selective deposition of a growth-inhibiting layer 280 on an upper portion 275 and/or on barrier layer 265 and seed layer 270 disposed on the field 260 of the substrate 210. In the aspect shown in FIG. 3C, the growth-inhibiting layer 280 is disposed on an upper portion 275 and on barrier layer 265 and seed layer 270 disposed on the field 260 of the substrate 210. In one aspect not shown, the growth-inhibiting layer 280 is deposited over only the field 260 of the substrate 210.

The growth-inhibiting layer 280 is typically formed of materials that form native oxides or other compounds that limit or inhibit copper nucleation thereon. For example aluminum, aluminum oxide, or a silicon-material may be used to inhibit growth of copper material on a copper seed layer. Selective deposition of the growth-inhibiting layer 280 on the upper portion 275 of the sidewalls 252 and/or field 260 of the substrate 210 may be achieved by a high pressure physical vapor deposition method or the IMP-PVD process described herein. While not shown, the growth-inhibiting layer 280 on the upper portion 275 of the sidewalls 252 and field 260 may be exposed to an etching process as described herein to remove the growth-inhibiting layer 280 from the upper portion 275 of the sidewalls 252 while retaining a portion of the growth-inhibiting layer 280 on the field 260.

For example, in an IMP-PVD process, a plasma gas of an inert gas is then introduced into the chamber 100 to stabilize the chamber pressure at between about 10 mTorr and 100 mTorr. A bias between about 1000 Watts (W) and about 5000 W, and a coil RF power between about 1000 W and about 5000 W are delivered to an aluminum target and coil, respectively. The substrate support 112 is heated to a temperature of between about 100° C. and 150° C. The growth-inhibiting layer 280 of aluminum may be deposited to a thickness between about 50 Å and about 1000 Å, for example, about 300 Å.

In a physical vapor deposition process, a plasma gas of argon is introduced into the processing chamber at a flow rate of about 40 sccm to establish a processing pressure of between about 1 mTorr and about 5 mTorr, for example, about 2 mTorr. A bias between about 500 Watts (W) and about 5000 W, for example, about 1000 W, is applied to an aluminum target. The substrate is maintained at a temperature between about 100° C. and about 150° C. The growth-inhibiting layer 280 of aluminum may be deposited to a thickness between about 50 Å and about 1000 Å, for example about 300 Å.

The barrier layer 265, the seed layer 270, and the growth-inhibiting layer 280, may be deposited consecutively without moving the substrate 210 into an ambient environment between deposition steps. Preventing exposure to ambient environments prevents the formation of unwanted oxides or exposure to contaminants, which may detrimentally affect good adhesion between the barrier layer 265 and the seed layer 270. This may be accomplished by depositing the three layers in one or more IMP-PVD or PVD chambers on a single system, such as the Centura™ platform or Endura™ platform, available from Applied Materials, Inc., of Santa Clara, Calif.

Optionally, following deposition of the growth-inhibiting layer 280, deposited material, such as aluminum from the examples described herein, may be removed from inside the aperture so that the growth-inhibiting layer is disposed on the substrate surface. The growth-inhibiting layer material within the aperture may be removed by a liquid etch process. The liquid etching process non-selectively removes growth-inhibiting layer material within the aperture and the substrate surface. However, it is believed that the growth-inhibiting layer material within the aperture in less than the surface layer material, for example, about 200 Å to 300 Å of growth-inhibiting layer material within the aperture compared to about 500 Å on the substrate surface, to allow removal of the growth-inhibiting layer material within the aperture while providing sufficient growth-inhibiting layer material on the substrate surface.

Aluminum may be removed from the inside of the aperture by one of the following etch solutions. A first removal composition of Keller's etching solution comprising about 5 ml of nitric acid, about 3 ml of hydrochloric acid, about 2 ml of hydrofluoric acid and about 190 ml of distilled water may be used as an etching solution. A second removal composition of Knolls's reagent comprising about 6 ml of nitric acid, about 2 ml of hydrofluoric acid and about 92 ml of distilled water may also be used as an etching solution. A third removal composition comprising between about 0.1 ml and about 10 ml of hydrofluoric acid and between about 90 ml and about 100 ml of distilled water may be used as an etching solution. A fourth removal composition comprising about 25 ml of methanol, about 25 ml of hydrochloric acid, about 25 ml of nitric acid, and about 1 ml (drop) of hydrofluoric acid may be used as an etching solution. The etch solution is provided for sufficient time, such as between about 5 seconds and about 60 seconds, or any other suitable time to remove the necessary amount of material from within the aperture.

Figure 3D:
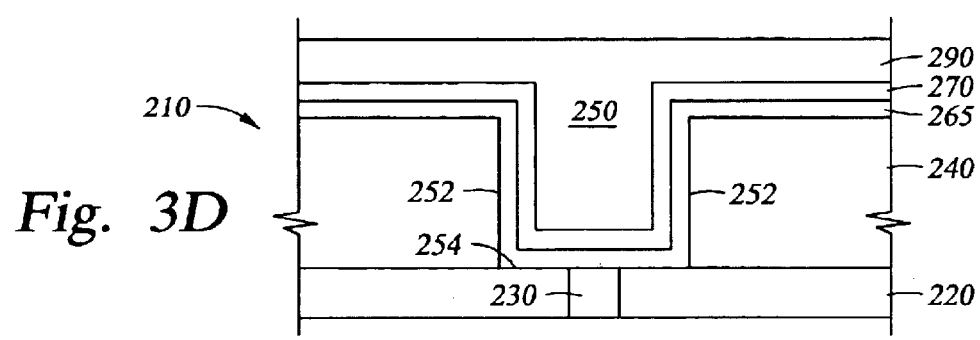

After depositing the growth-inhibiting layer 280, the aperture 250 is filled with a conductive material 290 as shown in FIG. 3D. For example, the conductive material 290 may be copper. The conductive material 290 may be deposited according to methods known in the art, for example, by an electrochemical deposition technique, such as electroplating. An example of an electroplating process is more fully described in U.S. Pat. No. 6,113,771, issued on Sep. 5, 2000, which is incorporated by reference herein to the extent not inconsistent with the claims aspects or disclosure herein.

In one embodiment, the conductive material 290 is deposited by an electroplating process, which includes disposing the substrate in an electrochemical processing cell and exposed to an electrolytic solution with an applied power between the substrate and an electrode disposed in the processing cell. A power source is coupled to the conducting seed layer on the substrate surface in order to attract ions from the solution. The ions deposit on the seed layer, and to a lesser extent on the growth-inhibiting layer 280, and fill the aperture 250. Acidic electrolyte, i.e., pH of less than about 7, may remove the growth-inhibiting layer 280 during the deposition of the conductive material 290 as shown in FIG. 2D. Alternatively, the material of the growth-inhibiting layer 280 or the composition of the electrolytic solution may retain the growth-inhibiting layer 280 during deposition of the conductive material 290 during the electroplating process.

Generally, the conductive layer 290 is deposited on the seed layer 270 at a rate between about 500 angstroms per minute (Å/min) and about 3500 Å/min greater than on the growth-inhibiting layer 280. For Example, the conductive layer 290 is deposited on the seed layer 270 between about 500 Å/min and about 3500 Å/min and the conductive layer 290 is observed to be non-detectable on the growth-inhibiting layer 280.

The presence of the growth-inhibiting layer 280 on the sidewalls of the apertures promotes fill of the aperture from the bottom of the aperture to the top of the aperture without void formation during deposition of fill material, such as copper by an electroplating process. The presence of the growth-inhibiting layer 280 on the field 260 of the substrate reduces or minimizes excess deposition of material thereon. This efficient use of material allows for fill of the apertures with little overburden and topographical variation of the overburden of the deposited layers. Substrate deposited by the methods described in FIGS. 3A-3D were observed to have minimal or reduced variations in heights between valleys and peaks over wide and narrow apertures respectively, and greater planarization of the substrate surface prior to any subsequent planarization process.

Figure 3E:
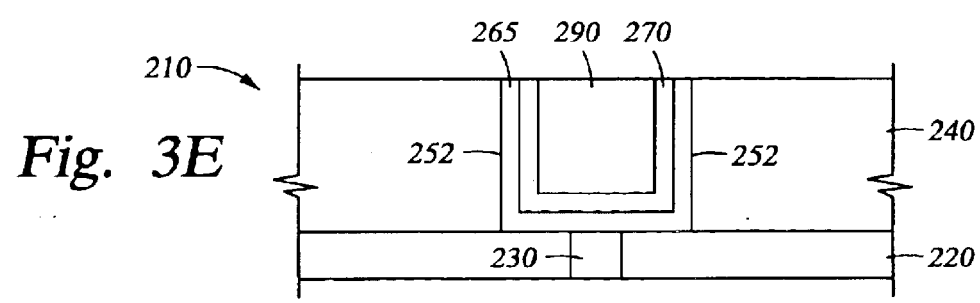

After the aperture 250 is filled, the substrate 210 is transferred to a chemical mechanical polishing system or etching system, where the excess material is removed from the substrate 210 and the aperture 250 is planarized as shown in FIG. 3E.

While the foregoing is directed to embodiments of the present invention, other and further embodiments of the invention may be devised without departing from the basic scope thereof, and the scope thereof is determined by the claims that follow.

What is claimed is:

1. A method for processing a substrate having a field and an aperture comprising a bottom and sidewalls formed therein, the method comprising:
   depositing a seed layer on the bottom and sidewalls of the aperture;
   depositing a growth-inhibiting layer on at least one of the field of the substrate and an upper portion of the sidewalls of the aperture; and then
   depositing a conductive layer on the growth-inhibiting layer and the seed layer, wherein the conductive layer is deposited on the seed layer at a rate between about 500 angstroms per minute and about 3500 angstroms per minute greater than on the growth-inhibiting layer.

2. The method of claim 1, wherein the growth-inhibiting layer comprises a material selected from the group of silicon, silicon dioxide, aluminum, aluminum oxide, tantalum, tantalum oxide, nickel, nickel oxide, titanium, titanium oxide, tungsten, tungsten oxide, and combinations thereof.

3. The method of claim 1, wherein the growth-inhibiting layer is deposited by a physical vapor deposition technique selected from the group of a high-pressure physical vapor deposition technique, an ionized metal plasma physical vapor deposition technique, or a self-ionized plasma physical vapor deposition technique.

4. The method of claim 1, wherein the seed layer is deposited by physical vapor deposition technique, chemical vapor deposition technique, or electroless deposition technique.

5. The method of claim 1, wherein the conductive layer is deposited by an electrochemical deposition technique.

6. The method of claim 5, wherein at least a portion of the growth-inhibiting layer is removed during deposition of the conductive layer.

7. The method of claim 6, wherein the seed layer comprises copper, the growth-inhibiting layer comprises aluminum, and the conductive layer comprises copper.

8. The method of claim 1, wherein the conductive layer fills the aperture from the bottom of the aperture to the field of the substrate.

9. A method for processing a substrate having a field and an aperture comprising a bottom and sidewalls formed therein, the method comprising:
   depositing a first copper layer on the bottom and sidewalls of the aperture;
   depositing a growth inhibiting material selected from the group of silicon dioxide, aluminum, tantalum, nickel, titanium, tungsten, and combinations thereof, on at least one of the field of the substrate and an upper portion of the sidewalls of the aperture; and
   depositing a second copper layer on the growth inhibiting material and the first copper layer, wherein the second copper layer is deposited on the first copper layer at a greater rate than on the growth inhibiting material and the second copper is deposited on the first copper seed layer at a rate between about 500 angstroms per minute and about 3500 angstroms per minute greater than on the growth-inhibiting material.

10. The method of claim 9, wherein the second copper layer selectively fills the aperture from the bottom of the aperture to the field of the substrate.

11. The method of claim 9, wherein the first copper layer is deposited by at least one of a physical vapor deposition technique, a chemical vapor deposition technique, and an electroless deposition technique, the growth inhibiting material is deposited by a physical vapor deposition technique, and the second copper layer is deposited by an electrochemical deposition technique.

12. The method of claim 11, wherein at least a portion of the growth-inhibiting layer is removed during deposition of the second copper layer.

13. A method for processing a substrate having a field and an aperture comprising a bottom and sidewalls formed therein, the method comprising:
   depositing a seed layer on the bottom and sidewalls of the aperture;
   depositing a growth-inhibiting layer on at least one of the field of the substrate and an upper portion of the sidewalls of the aperture; and
   depositing a conductive layer on the seed layer at a rate between about 500 angstroms per minute and about 3500 angstroms per minute greater than on the growth-inhibiting layer, wherein at least a portion of the growth-inhibiting layer is removed during deposition of the conductive layer.

14. The method of claim 13, wherein the growth-inhibiting layer comprises a material selected from the group of silicon, silicon dioxide, aluminum, aluminum oxide, tantalum, tantalum oxide, nickel, nickel oxide, titanium, titanium oxide, tungsten, tungsten oxide, and combinations thereof.

15. The method of claim 13, wherein the growth-inhibiting layer is deposited by a physical vapor deposition technique selected from the group of a high-pressure physical vapor deposition technique, an ionized metal plasma physical vapor deposition technique, or a self-ionized plasma physical vapor deposition technique.

16. The method of claim 13, wherein the seed layer is deposited by physical vapor deposition technique, chemical vapor deposition technique, or electroless deposition technique.

17. The method of claim 13, wherein the conductive layer is deposited by an electrochemical deposition technique.

18. The method of claim 13, wherein the seed layer is deposited by physical vapor deposition technique, and chemical vapor deposition technique, or electroless deposition technique, the growth inhibiting material is deposited by a physical vapor deposition technique, and the conductive material is deposited by an electrochemical deposition technique.

19. The method of claim 13, wherein the seed layer comprises copper, the growth-inhibiting layer comprises aluminum, and the conductive layer comprises copper.

20. The method of claim 13, wherein the conductive layer fills the aperture from the bottom of the aperture to the field of the substrate.

21. A method for processing a substrate having a field and an aperture comprising a bottom and sidewalls formed therein, the method comprising:
  depositing a nucleation layer on the bottom and sidewalls of the aperture;
  depositing a nucleation inhibiting material selected from the group of silicon, silicon dioxide, aluminum, aluminum oxide, tantalum, tantalum oxide, nickel, nickel oxide, titanium, titanium oxide, tungsten, tungsten oxide, and combinations thereof, on at least one of the field of the substrate and an upper portion of the sidewalls of the aperture; and
  depositing a conductive material on the nucleation layer and the nucleation inhibiting material by an electrochemical deposition technique.

22. The method of claim 21, wherein the nucleation inhibiting material is deposited by a physical vapor deposition technique selected from the group of a high-pressure physical vapor deposition technique, an ionized metal plasma physical vapor deposition technique, or a self-ionized plasma physical vapor deposition technique.

23. The method of claim 21, wherein at least a portion of the nucleation inhibiting material is removed during deposition of the conductive layer.

24. The method of claim 21, wherein the conductive layer is deposited on the nucleation layer at a rate between about 500 angstroms per minute and about 3500 angstroms per minute greater than on the nucleation inhibiting layer.

25. The method of claim 21, wherein the conductive layer fills the aperture from the bottom of the aperture to the field of the substrate.

26. The method of claim 1, further comprising etching the growth-inhibiting layer from the aperture.

27. The method of claim 9, further comprising etching the growth-inhibiting layer from the aperture.

28. The method of claim 13, further comprising etching the growth-inhibiting layer from the aperture.

29. The method of claim 21, further comprising etching the nucleation inhibiting material from the aperture.

30. A method for processing a substrate having a field and an aperture comprising a bottom and sidewalls formed therein, the method comprising:
  depositing a barrier layer on the bottom and sidewalls of the aperture;
  depositing a seed layer on the barrier layer on the bottom and sidewalls of the aperture;
  depositing a growth-inhibiting layer over the seed layer on at least one of the field of the substrate and an upper portion-of the sidewalls of the aperture; and then
  depositing a conductive layer on the growth-inhibiting layer and the seed layer, wherein the seed layer and the conductive layer comprise the same material.

31. The method of claim 30, wherein the growth-inhibiting layer comprises a material selected from the group of silicon, silicon dioxide, aluminum, aluminum oxide, tantalum, tantalum oxide, nickel, nickel oxide, titanium, titanium oxide, tungsten, tungsten oxide, and combinations thereof and is deposited by a physical vapor deposition technique selected from the group of a high-pressure physical vapor deposition technique, an ionized metal plasma physical vapor deposition technique, or a self-ionized plasma physical vapor deposition technique.

32. The method of claim 30, wherein the seed layer is deposited by physical vapor deposition technique, chemical vapor deposition technique, or electroless deposition technique and the conductive layer is deposited by an electrochemical deposition technique.

33. The method of claim 30, wherein at least a portion of the growth-inhibiting layer is removed during deposition of the conductive layer.

34. The method of claim 30, wherein the seed layer comprises copper, the growth-inhibiting layer comprises aluminum, and the conductive layer comprises copper.

35. The method of claim 30, wherein the conductive layer is deposited on the seed layer at a rate between about 500 angstroms per minute and about 3500 angstroms per minute greater than on the growth-inhibiting layer.

* * * * *